| United States Patent [19] | [11] 4,410,987 |
|---|---|
| Ptasinski et al. | [45] Oct. 18, 1983 |

[54] PRELOAD TEST CIRCUIT FOR PROGRAMMABLE LOGIC ARRAYS

[75] Inventors: James F. Ptasinski; Glenn Wheeler, both of Dallas, Tex.

[73] Assignee: Texas Instruments Incorporated, Dallas, Tex.

[21] Appl. No.: 282,790

[22] Filed: Jul. 13, 1981

[51] Int. Cl.³ ............................................. G01R 31/28
[52] U.S. Cl. .................................... 371/25; 324/73 R
[58] Field of Search ........................ 371/25, 15, 21, 27; 324/73 R; 307/465

[56] References Cited

U.S. PATENT DOCUMENTS

| 3,789,205 | 1/1974 | James | 371/25 |
| 3,961,254 | 6/1976 | Cavaliere et al. | 371/21 |
| 4,074,851 | 2/1978 | Eichelberger et al. | 371/25 |
| 4,298,980 | 11/1981 | Hajdu et al. | 371/25 |
| 4,363,124 | 12/1982 | Aichelmann, Jr. | 371/25 |

*Primary Examiner*—Charles E. Atkinson

*Attorney, Agent, or Firm*—Douglas A. Lashmit; N. Rhys Merrett; Melvin Sharp

[57] ABSTRACT

A circuit and a method of operation thereof are disclosed which provides an enhanced test feature for programmable logic arrays. Programmable logic arrays (PLA's) are becoming more complex and many utilize feedback into the array as part of their normal logic function. Those devices utilizing feedback require an abnormally large number of logic cycles to be run in order to provide a known feedback input into the output circuitry so that the combination of all input signals into the array is known. The preload circuit disclosed herein provides a method of applying a known signal to the feedback circuitry, thereby reducing the number of cycles required to complete a test function as well as reducing the number of pins required for the test feature. The circuit is readily fabricated in an integrated circuit form in conjunction with the PLA circuitry. The test circuitry is readily adapted to high speed automated test equipment.

4 Claims, 1 Drawing Figure

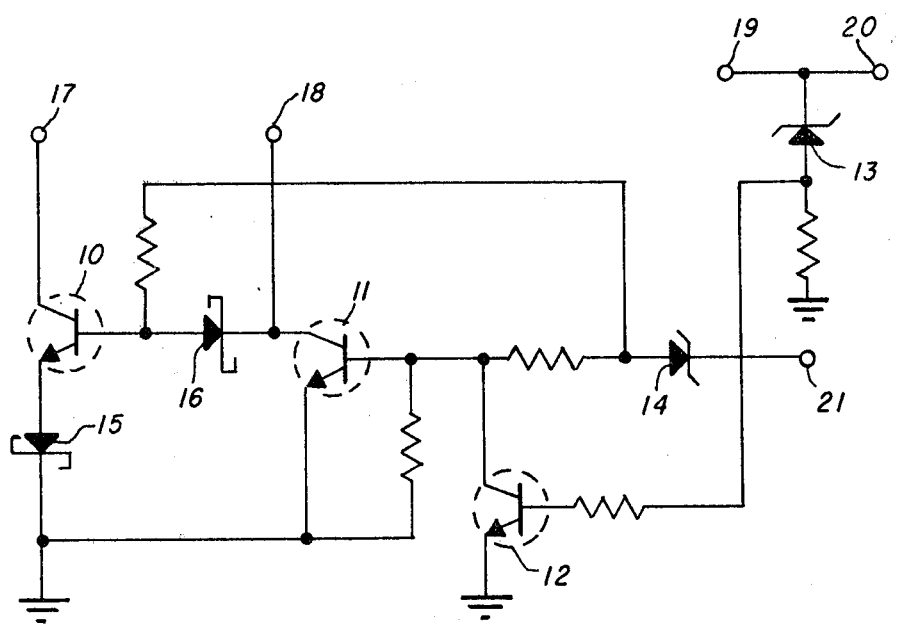

PRELOAD TEST CIRCUIT FOR PROGRAMMABLE LOGIC ARRAYS

BACKGROUND OF THE INVENTION

Programmable logic arrays (PLA's) are becoming more complex and many utilize feedback into the array as part of their normal logic function. Those devices utilizing feedback require an abnormally large number of logic cycles to be run in order to provide a known feedback input into the output circuitry, so that the combination of all input signals into the array, both from feedback as well as input circuitry are known.

The testing of PLA's has become more complex with the increase in functional capability of the device. There are two methods of testing PLA's. The first is an array verify which checks to see which of the fuses have been blown in the PLA and which are still functional. This method of testing has inherent disadvantages in that the logical functioning of the device is not thoroughly tested. The second method of testing is a logical verify which applies a data set at the inputs and then through changing the data sets checks the output to determine the proper logical flow through the device. Since the number of logical inputs and outputs becomes very large with the ever increasing number of connections, inputs, and outputs of the devices, this method of testing begins to take on an inordinate amount of time to thoroughly test the logic. See T. L. Larson, et al, "Field Programmable Logic Devices" Electronic Engineering, January, 1980, p. 37 at p. 47 for a more detailed background discussion.

One method of shortening the required test time for a complete logical test is to preset the feedback circuitry at the outputs of the device with a known data high signal. Thereafter, when input is presented to the array the feedback circuits will also present known data in the form of a high signal. Another method is to use a clear function to preset the feedback circuit in the outputs with a low data signal. This is essentially the same as preset in function. They do, however, present certain limitations.

The combination of a clear option or preset high signal option would require additional pins on the device and is therefore not an optimum solution. Additionally, with a multitude of outputs having feedback circuitry, the selective use of high signals on some feedback circuitry and low signals on the remaining circuitry is not possible utilizing the clear or preset mode of operation.

Accordingly, it is an object of the present invention to provide a programmable logic array device with an enhanced testability feature, wherein the time required for a complete logical test is considerably shortened.

Another object of the present invention is to provide an optional preset or clear function within a programmable logic array device, wherein feedback circuitry at the outputs may be preloaded with a selected data signal, utilizing the same number of pin connections.

SUMMARY AND BRIEF DESCRIPTION OF THE INVENTION

Briefly, and in accordance with the present invention, a programmable logic array is comprised of a plurality of input connections, a plurality of output connections, a system of programmable interconnections within the array, and at least one feedback circuit connected to one of the output connections providing additional input to the programmable interconnections and is characterized in that the feedback circuit comprises additional circuitry which is capable of preloading a data bit selected by a test program into the feedback circuitry from one output connection as the additional input.

The preload circuit provides an enhanced testability for programmable logic array devices and is comprised of a signal input connection, the preload circuit enable connection, and at least one connection for input to a feedback circuit of a programmable logic device wherein the preload circuit operates to set a data bit signal selected by a test program into the feedback circuit.

The preload circuit signal input connection normally functions as an array output connection on the device.

The preload circuit enable connection is common with all array outputs which provide a feedback signal to the array.

The connection in the preload circuit to a feedback circuit is comprised of circuitry capable of relating a data bit from the signal input connection to a latch or register contained in the feedback circuitry for subsequent further relation into the programmed logic connections within the array of a programmable logic array device.

Additionally, a method for providing a known feedback input into a programmable logic array is comprised of the steps of setting each of the outputs of the programmable logic array having feedback circuitry to a selected high or low state, respectively, and then pulsing a preload circuitry enable input to load the selected high or low state signals into the feedback circuitry.

The present invention provides a method of testing programmable logic array devices by preloading each of the outputs of the programmable logic array devices having a feedback circuit with a selected high or low signal, respectively, then presenting a known data set into the inputs of the devices, and then checking the outputs of the devices for a desired data set output.

A test program for a PLA incorporating the present invention incorporates a preload step prior to inputting data to the array. In this step, each output having a feedback latch or register is set either high or low. Thereafter when the first data set is presented to the array, all array inputs are known, including the feedback inputs to the array.

Other objects and features of the invention will become more readily understood from the following detailed description when read in conjunction with the appended claims and accompanying drawing which is a schematic diagram of a circuit depicted as it is constructed as a portion of a programmable logic array circuit according to the present invention.

DETAILED DESCRIPTION OF THE DRAWING

Referring now to the drawing, a schematic diagram of a circuit according to the present invention is shown as it is built upon an integrated circuit chip. The drawing is a portion of a PLA circuit, and is connected to the PLA at connections 19, 17, and 18. Zener diode 13 is used to isolate the preload circuitry from the normal functioning of the device. The output latch, register or buffer signal will normally be connected at 19 and is electrically common with the device output 20. Connection 21 is the preload circuit enable connection and also is normally isolated from the preload circuitry by zener diode 14. Preload circuit outputs 17 and 18 are connected to the feedback circuitry of the PLA output and in normal logical operation will have no affect on the operation of the circuit. However, when the preload circuitry is enabled by application of sufficiently high voltage at connection 21, for example, nine volts, zener diode 14 breaks down applying a voltage transmitted to the cathode of Schottky diode 16 and the base of transistor 10. Thus, with no breakdown of zener diode 13 connected to the PLA output at 20, and a preload circuit enable signal at 21 applied, breaking down zener diode 14, a high signal will be translated through the circuitry to the feedback connection 17 and a low signal at 18 since transistor 11 will be turned on and will be conducting to ground.

However, when a high signal is applied at 20, for example, nine volts, and is sufficient to cause reverse breakdown of zener diode 13, and at the same time a high signal is applied at 21 causing the reverse breakdown of zener diode 14, the output conditions of connections 17 and 18 reverse in the following manner. The connection at 20 causes a voltage through zener diode 13 and causes transistor 12 to conduct bringing the base of transistor 11 low causing transistor 11 to turn off; therefore, connecton 17 will be low and connection 18 will be high due to the shorting effect of Schottky diode 16 causing transistor 10 to conduct to ground.

The output circuitry, for example a register of a PLA, is connected to the array and through connection 19 to the preload circuitry. It is further connected to the preload circuitry by the connection of 17 to one side of the register circuit and the connection of 18 of the other side such that when a high signal is applied to one and low to the other, that condition will be imposed upon the feedback circuitry.

The Larson article, cited above, is incorporated herein by reference, and illustrates a typical PLA capable of incorporating the present invention in his FIG. 7, on page 45. Four of the outputs on that device have register feedback inputs to the array, and therefore, each of those four outputs could be individually preloaded if the preload circuit disclosed herein were added to each of the output circuits having register feedback.

In actual operation, the PLA circuit has power applied, and the outputs are disabled, i.e., placed in a high impedance state in a preferred embodiment to protect the output circuitry from the preload data signal which is on the order of twice the voltage at which the output operates. The desired input for the feedback is presented at the circuit output 20. The voltage level is higher than normal PLA voltage and is sufficient to reverse current flow in zener diode 13. If the condition is low then no current flows through diode 13. A plurality of these circuits have different signals applied to the feedback circuitry by the proper application of high or low signals to the desired output connection. Upon the setting of each output voltage the preload circuit enable connection 21, which is common with all outputs of the device having feedback circuitry, is pulsed with a voltage sufficient to reverse breakdown zener diode 14 in each of the preload circuits. This results in the desired data imposed at 20 to be related through the preload circuitry into the feedback circuitry connected at 17 and 18.

The feedback inputs into the array are now loaded, and the input data is fed into the inputs while the outputs are monitored to verify the logical operations.

The disclosed invention is readily fabricated in conjunction with programmable logic array circuitry in an integrated circuit manner.

Furthermore, the use of the feedback preload capability enables the design of a test program capable of independently testing each of the logic functions of a arbitrarily designed programmable logic array device without the requirement of an inordinately large number of cycles required to know the state of the feedback circuit. Thus, the test sequence may be preprogrammed or may be computer generated as an adjunct to the design of the programmable logic array device.

While the principles of this invention have been described in connection with a specific circuit, it is to be understood that this description is made only by way of example and not as a limitation to the scope of the invention. The disclosed invention may also be used in applications other than programmable logic arrays, wherein a latch or register is incorporated into the circuitry of a device for temporary memory and further input into the device. Numerous other circuits using this invention may be devised by those skilled in the art. For example, gate arrays, logic sequencers, and other programmable devices can employ the present invention without departing from the spirit and scope of the appended claims.

What is claimed is:

1. A preload circuit providing an enhanced testability for programmable logic array devices comprising a signal input connection, a preload circuit enable connection, and at least one connection for input to a feedback circuit of a programmable logic device, wherein said preload circuit operates to set a data bit signal selected by a test program into said feedback circuit.

2. A preload circuit as in claim 1, wherein said signal input connection normally functions as an array output connection.

3. A preload circuit as in claim 1, wherein said preload circuit enable connection is common with all array outputs providing a feedback signal.

4. A method of testing programmable logic array devices comprising:
   (a) preloading each of the outputs of said programmable logic array devices having feedback circuitry with a selected high or low signal, respectively,
   (b) presenting a known data set into the inputs of said devices: and
   (c) monitoring the outputs of said devices for a desired data set output.

* * * * *

REEXAMINATION CERTIFICATE (2491st)

United States Patent [19]

Ptasinski et al.

[11] B1 4,410,987

[45] Certificate Issued   Feb. 28, 1995

[54] PRELOAD TEST CIRCUIT FOR PROGRAMMABLE LOGIC ARRAYS

[75] Inventors: James F. Ptasinski; Glenn Wheeler, both of Dallas, Tex.

[73] Assignee: Texas Instruments Incorporated, Dallas, Tex.

Reexamination Request:
No. 90/002,768, Jun. 26, 1992

Reexamination Certificate for:
Patent No.: 4,410,987
Issued: Oct. 18, 1983
Appl. No.: 282,790
Filed: Jul. 13, 1981

[51] Int. Cl.[6] .................................. G01R 31/28
[52] U.S. Cl. ........................................... 371/22.2
[58] Field of Search ................. 371/22.2, 22.1; 324/158 R; 307/465, 465.1

[56] References Cited

U.S. PATENT DOCUMENTS

4,267,463  5/1981  Mayumi ................. 307/445
4,422,072  12/1983  Cavlan ............... 340/825.87

FOREIGN PATENT DOCUMENTS

5476037  6/1979  Japan .

OTHER PUBLICATIONS

Larson, T. L. and Downey, C., "Field Programmable Logic Devices", Electronic Engineering, Jan. 1980.
Eichelberger & Williams, "A Logic Design Structure for LSI Testability", 14th Design Automation Conf., Jun. 20-22, 1977, pp. 462-468.

*Primary Examiner*—Charles E. Atkinson

[57] ABSTRACT

A circuit and a method of operation thereof are disclosed which provides an enhanced test feature for programmable logic arrays. Programmable logic arrays (PLA's) are becoming more complex and many utilize feedback into the array as part of their normal logic function. Those devices utilizing feedback require an abnormally large number of logic cycles to be run in order to provide a known feedback input into the output circuitry so that the combination of all input signals into the array is known. The preload circuit disclosed herein provides a method of applying a known signal to the feedback circuitry, thereby reducing the number of cycles required to complete a test function as well as reducing the number of pins required for the test feature. The circuit is readily fabricated in an integrated circuit form in conjunction with the PLA circuitry. The test circuitry is readily adapted to high speed automated test equipment.

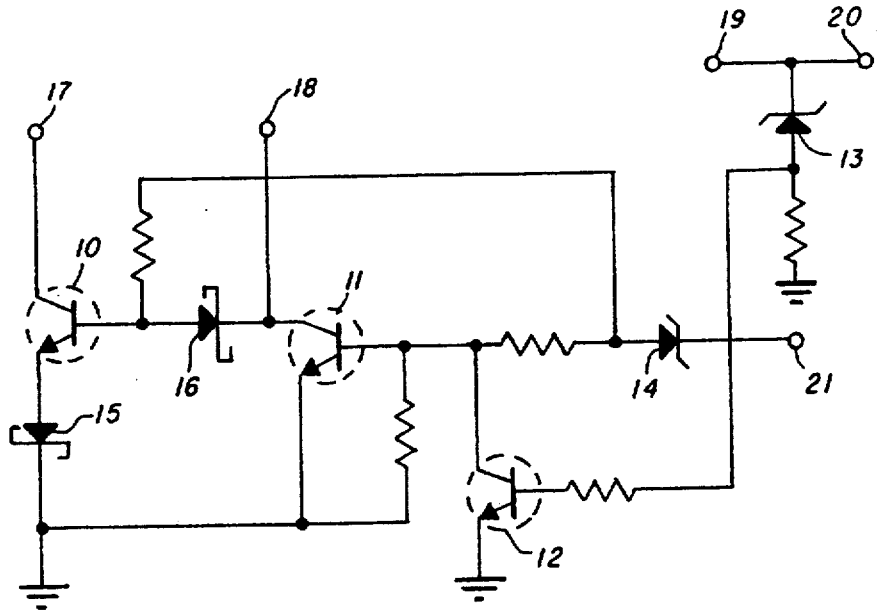

REEXAMINATION CERTIFICATE ISSUED UNDER 35 U.S.C. 307

THE PATENT IS HEREBY AMENDED AS INDICATED BELOW.

Matter enclosed in heavy brackets [] appeared in the patent, but has been deleted and is no longer a part of the patent; matter printed in italics indicates additions made to the patent.

AS A RESULT OF REEXAMINATION, IT HAS BEEN DETERMINED THAT:

Claim 4 is cancelled.

Claims 1–3 were not reexamined.

* * * * *